(12) United States Patent
Kim et al.

(10) Patent No.: US 8,288,938 B2
(45) Date of Patent: Oct. 16, 2012

(54) ORGANIC LIGHT EMITTING DISPLAY DEVICE WITH AN OUTER CIRCUMFERENTIALLY ARRAY OF FLEXIBLE PRINTED CIRCUIT BOARD AND COUPLING PADS

(75) Inventors: Tae-Jin Kim, Suwon-si (KR); Bon-Seog Gu, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 926 days.

(21) Appl. No.: 12/216,895

(22) Filed: Jul. 11, 2008

(65) Prior Publication Data

US 2009/0184626 A1  Jul. 23, 2009

(30) Foreign Application Priority Data

Jan. 18, 2008 (KR) .................. 10-2008-0005617

(51) Int. Cl.
*H01J 63/04* (2006.01)
(52) U.S. Cl. ..................................... 313/504
(58) Field of Classification Search .......... 313/506, 313/510–512, 493, 498; 345/36, 37, 41, 345/44, 47, 60, 73, 74.1, 76, 82; 362/84
See application file for complete search history.

(56) References Cited

U.S. PATENT DOCUMENTS

| 2007/0134830 | A1 | 6/2007 | Park et al. |
| 2007/0216299 | A1 | 9/2007 | Park et al. |
| 2007/0235791 | A1* | 10/2007 | Park et al. .............. 257/312 |

FOREIGN PATENT DOCUMENTS

| JP | 8-1502 | 10/1996 |
| JP | 2002032037 | 1/2002 |
| JP | 2003330386 | 11/2003 |
| JP | 2004133289 | 4/2004 |
| JP | 2005173579 | 6/2005 |
| JP | 2005222001 | 8/2005 |
| JP | 2006039541 | 2/2006 |
| JP | 2006-302626 | 11/2006 |
| JP | 2007287503 | 11/2007 |
| JP | 2007304394 | 11/2007 |
| KR | 10-2005-0065833 | 6/2005 |
| KR | 1020050065947 A | 6/2005 |

(Continued)

OTHER PUBLICATIONS

Transmitter letter and Korean Office Action issued on Jun. 29, 2009 for the corresponding Korean Priority Application No. 10-2008-0005617.

Japanese Office Action dated Nov. 24, 2010, corresponding to Japanese Patent Application No. 2008-079280, together with a Request for Entry.

(Continued)

*Primary Examiner* — Anh Mai
*Assistant Examiner* — Brenitra Lee
(74) *Attorney, Agent, or Firm* — Robert E. Bushnell, Esq.

(57) ABSTRACT

An organic light emitting display which minimizes the IR drop of voltages supplied to an organic light emitting display panel includes an organic light emitting display panel having a pixel unit on which an image is displayed and first and second power source pads provided at two or more edges outside the pixel unit to receive first and second voltages from at least two directions, and a voltage supplier Flexible Printed Circuit Board (FPCB) including pads electrically coupled to the first and second power source pads and arranged on the outer circumference of the organic light emitting display so as not to overlap with the pixel unit.

13 Claims, 3 Drawing Sheets

FOREIGN PATENT DOCUMENTS

| KR | 1020050067832 A | 7/2005 |
| KR | 10-2005-0082963 | 8/2005 |
| KR | 1020050110463 A | 11/2005 |
| KR | 10-2007-0051619 | 5/2007 |

OTHER PUBLICATIONS

European Patent Application No. 09250124.6, dated Dec. 9, 2010, corresponding to Korean Priority Application No. 10-2008-0005617.

* cited by examiner

ORGANIC LIGHT EMITTING DISPLAY DEVICE WITH AN OUTER CIRCUMFERENTIALLY ARRAY OF FLEXIBLE PRINTED CIRCUIT BOARD AND COUPLING PADS

CLAIM OF PRIORITY

This application makes reference to, incorporates the same herein, and claims all benefits accruing under 35 U.S.C. §119 from an application for ORGANIC LIGHT EMITTING DISPLAY earlier filed in the Korean Intellectual Property Office on the 18$^{th}$ of January 2008 and there duly assigned Serial No. 10-2008-0005617.

BACKGROUND OF THE INVENTION

1. Field of the Invention

The present invention relates to an organic light emitting display, and more particularly, the present invention relates to an organic light emitting display which minimizes the IR drop of power sources supplying power to an organic light emitting display panel.

2. Description of the Related Art

Among Flat Panel Displays (FPDs), organic light emitting displays display images using Organic Light Emitting Diodes (OLEDs) that generate light by re-combination of electrons and holes. Since an organic light emitting display has a high response speed and low power consumption, organic light emitting displays have been spotlighted as next generation displays.

In general, an organic light emitting display includes a pixel unit including a plurality of pixels, driving circuits for supplying driving signals to the pixel unit, and a power source for supplying power to the pixel unit.

The pixels emit light with a brightness corresponding to data signals supplied in synchronism with scan signals when the scan signals are supplied. The organic light emitting display panel then displays a predetermined image.

In the organic light emitting display, the emission brightness of the pixels is affected by the voltage supplied by the power sources. That is, the output of the power sources determine the emission brightness of the pixels together with the data signals.

Therefore, in order to display an image with uniform picture quality, the power sources must supply the same voltage to the pixels.

However, the power sources are Direct Current (DC) power sources having a predetermined voltage level and a voltage reduction IR drop occurs when a current passes through a power source line.

In particular, since the length of the power source line increases as the size of the display panel of the organic light emitting display increases, a brightness deviation between the pixels increases in accordance with the distance between the pixels and a power source pad that receives the output of the power sources.

Therefore, it is necessary to minimize the voltage reduction IR drop of the power sources.

SUMMARY OF THE INVENTION

Accordingly, it is an object of the present invention to provide an organic light emitting display which minimizes the voltage reduction IR drop of the power sources supplying power to an organic light emitting display panel.

In order to achieve the foregoing and/or other objects of the present invention, an organic light emitting display includes an organic light emitting display panel including a pixel unit on which an image is displayed and a plurality of first and second power source pads arranged at two or more edges outside the pixel unit to receive first and second voltages from at least two directions; and a voltage supplier Flexible Printed Circuit Board (FPCB) including a plurality of pads respectively electrically coupled to the first and second power source pads and being arranged on an outer circumference of the organic light emitting display to not overlap the pixel unit.

In addition, the plurality of first power source pads are arranged respectively at a first edge of one side of the organic light emitting display panel and a second edge facing the first edge. The plurality of second power source pads are formed respectively at a third edge of one side of the organic light emitting display panel and a fourth edge facing the third edge.

In addition, the plurality of first and second power source pads are formed at different edges of one side of the organic light emitting display panel.

In addition, each of the plurality of first and second power source pads receives the first and second voltages respectively from both directions of the voltage supplier FPCB.

In addition, a plurality of signal pads for supplying driving signals to the pixel unit are arranged between the plurality of first and second power source pads. The organic light emitting display further includes a driving FPCB electrically coupled to the signal pads and provided independently from the voltage supplier FPCB, and a driving board electrically coupled to the driving FPCB to drive the driving FPCB. Moreover, the driving board is arranged to not overlap the pixel unit. The driving board is electrically coupled to the voltage supplier FPCB to supply the first and second voltages to the voltage supplier FPCB. The driving FPCB includes at least one of a scan driver and a data driver and supplies at least one of a scan signal and a data signal to the pixel unit.

In addition, the pixel unit emits light from both sides thereof.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicated the same or similar components, wherein.

DETAILED DESCRIPTION OF THE INVENTION

Figure 1:
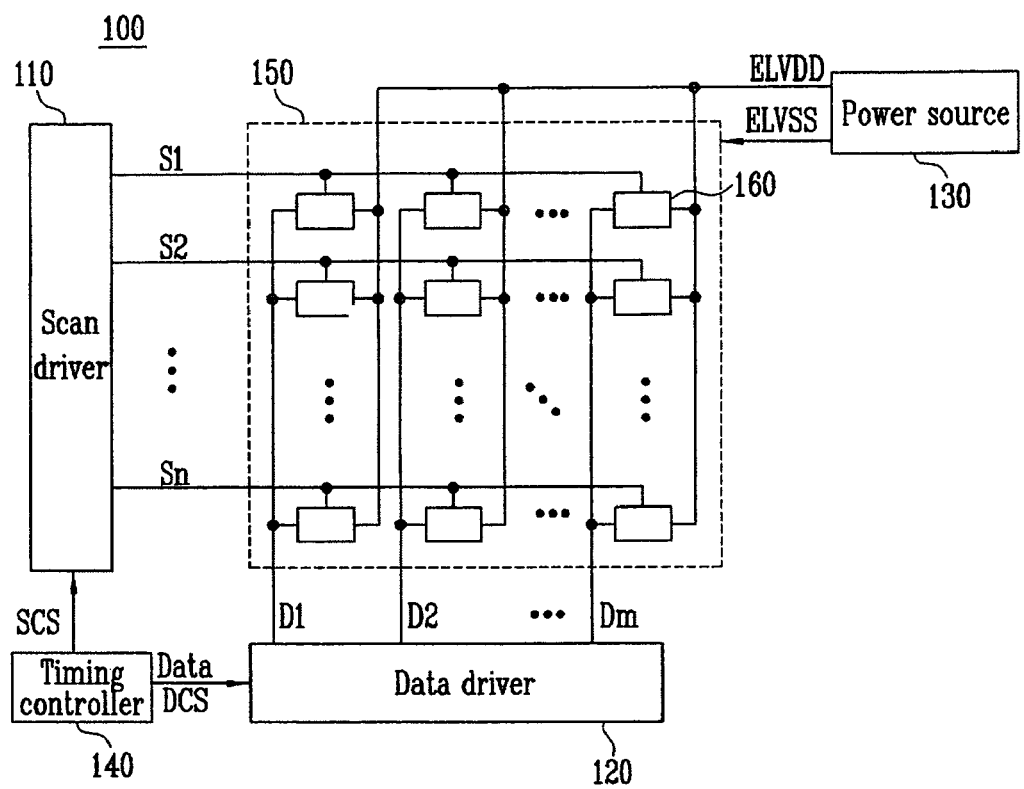
FIG. 1 is a block diagram of an example of an organic light emitting display according to an embodiment of the present invention.

Hereinafter, certain exemplary embodiments according to the present invention are described in detail with reference to the accompanying drawings. When a first element is described as being coupled to a second element, the first element may be not only directly coupled to the second element but may also be indirectly coupled to the second element via a third element. Furthermore, some of the elements that are not essential to the complete understanding of the present invention have been omitted for clarity. Also, like reference numerals refer to like elements throughout.

FIG. 1 is a block diagram of an example of an organic light emitting display according to an embodiment of the present invention.

Referring to FIG. 1, an organic light emitting display 100 includes a scan driver 110, a data driver 120, a timing controller 140, a pixel unit 150, and a power source 130.

The scan driver 110 generates scan signals to correspond to Scan Control Signals SCSs supplied by the timing controller 140. The scan signals generated by the scan driver 110 are sequentially supplied to scan lines S1 to Sn.

The data driver 120 generates data signals to correspond to Data and Data Control Signals DCSs supplied by the timing controller 140. The data signals generated by the data driver 120 are supplied to data lines D1 to Dm in synchronism with the scan signals.

The timing controller 140 generates the SCSs and the DCSs in response to externally supplied synchronizing signals. The SCSs generated by the timing controller 140 are supplied to the scan driver 110 and the DCSs are supplied to the data driver 120, in addition, the timing controller 140 transmits externally supplied Data to the data driver 120.

The pixel unit 150 includes a plurality of pixels 160 formed in regions partitioned off by the scan lines S1 to Sn and the data lines D1 to Dm. The pixel unit 150 displays an image to correspond to the scan signals supplied by the scan driver 110 and the data signals supplied by the data driver 120.

The power source 130 generates first and second voltages ELVDD and ELVSS using power supplied by an external power supply apparatus (not shown). Then, the power source 130 supplies the generated first and second voltages ELVDD and ELVSS to the pixel unit 150.

In the organic light emitting display 100, the pixel unit 150 is formed in the organic light emitting display panel. The scan driver 110 and/or the data driver 120 is mounted on the organic light emitting display panel or an additional Flexible Printed Circuit Board (FPCB). The scan driver 110 and/or the data driver 120 can be electrically coupled to the organic light emitting display panel through a pad unit.

In addition, the power source 130 and/or the timing controller 140 are mounted on a driving board outside the organic light emitting display panel to be electrically coupled to the organic light emitting display panel and/or the driving FPCBs through a FPCB.

Figure 2:
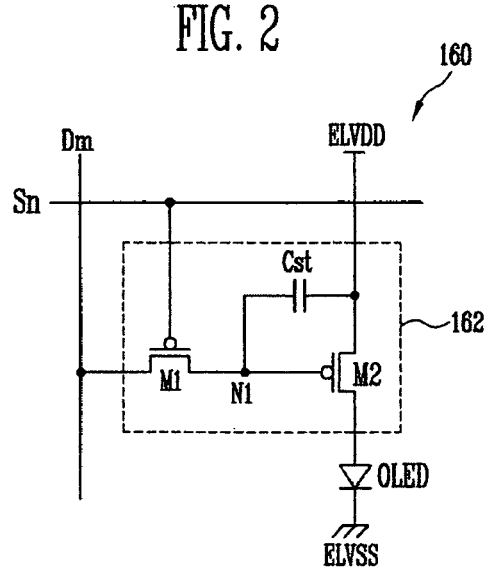
FIG. 2 is a circuit diagram of an example of a pixel of FIG. 1.

FIG. 2 is a circuit diagram of an example of a pixel of FIG. 1. For convenience sake, in FIG. 2, a pixel is coupled to an nth scan line Sn and an mth data line Dm.

Referring to FIG. 2, a pixel 160 includes an Organic Light Emitting Diode (OLED), the scan line Sn, the data line Dm, a first voltage line ELVDD, and a pixel circuit 162 coupled to the OLED.

The anode electrode of the OLED is coupled to the pixel circuit 162 and the cathode electrode is coupled to the second voltage line ELVSS. The OLED emits light with a brightness corresponding to the amount of current supplied by the pixel circuit 162.

The pixel circuit 162 includes a first transistor M1, a second transistor M2, and a storage capacitor Cst.

The first electrode of the first transistor M1 is coupled to the data line Dm, and the second electrode of the first transistor M1 is coupled to a first node N1. The gate electrode of the first transistor M1 is coupled to the scan line Sn. The first transistor M1 is turned on when a scan signal is supplied to the scan line Sn to transmit a data signal supplied to the data line Dm to the first node N1.

The first electrode of the second transistor M2 is coupled to the first voltage line ELVDD, and the second electrode of the second transistor M2 is coupled to the anode electrode of the OLED. The gate electrode of the second transistor M2 is coupled to the first node N1. The second transistor M2 controls current that flows from the first voltage line ELVDD to the anode electrode of the OLED to correspond to a voltage supplied to the gate electrode thereof.

One terminal of a storage capacitor Cst is coupled to the first node N1, and the other terminal of the storage capacitor Cst is coupled to the first voltage line ELVDD and the first electrode of the second transistor M2. The storage capacitor Cst stores a voltage corresponding to a data signal supplied to the first node N1 when the scan signal is supplied to the scan line Sn and maintains the stored voltage for one frame.

The operation process of the pixel 160 is described in detail as follows. First, when the scan signal is supplied to the scan line Sn, the first transistor M1 is turned on. When the first transistor M1 is turned on, the data signal supplied to the data line Dm is transmitted to the first node N1 through the first transistor M1. When the data signal is transmitted to the first node N1, a voltage corresponding to a difference between the voltage of the first voltage line ELVDD and the data signal is stored in the storage capacitor Cst. Then, the second transistor M2 controls current that flows from the first voltage line ELVDD to the OLED to correspond to a voltage supplied to the gate electrode thereof. Therefore, the OLED emits light with a brightness corresponding to the amount of current supplied thereto to display an image.

As described above, the pixel 160 emits light with a brightness corresponding to the amount of current supplied by the second transistor M2. The voltage of the first node N1 to which the gate electrode of the second transistor M2 is coupled is maintained for one frame by the storage capacitor Cst.

The storage capacitor Cst stores a voltage corresponding to a difference between the voltage of the first voltage line ELVDD and the data signal while the data signal is supplied to maintain the voltage for one frame. Therefore, the emission brightness of the pixel 160 varies in accordance with the voltage of the first voltage line ELVDD and the data signal.

The voltage of the first voltage line ELVDD supplied to the pixels 160 can vary by the voltage reduction IR Drop which occurs when passing through a power source line. Therefore, the pixels 160 that receive the same data signal emit light with different brightness so that picture quality can deteriorate.

Therefore, the voltage reduction IR Drop of the first voltage line ELVDD must be minimized.

Figure 3:
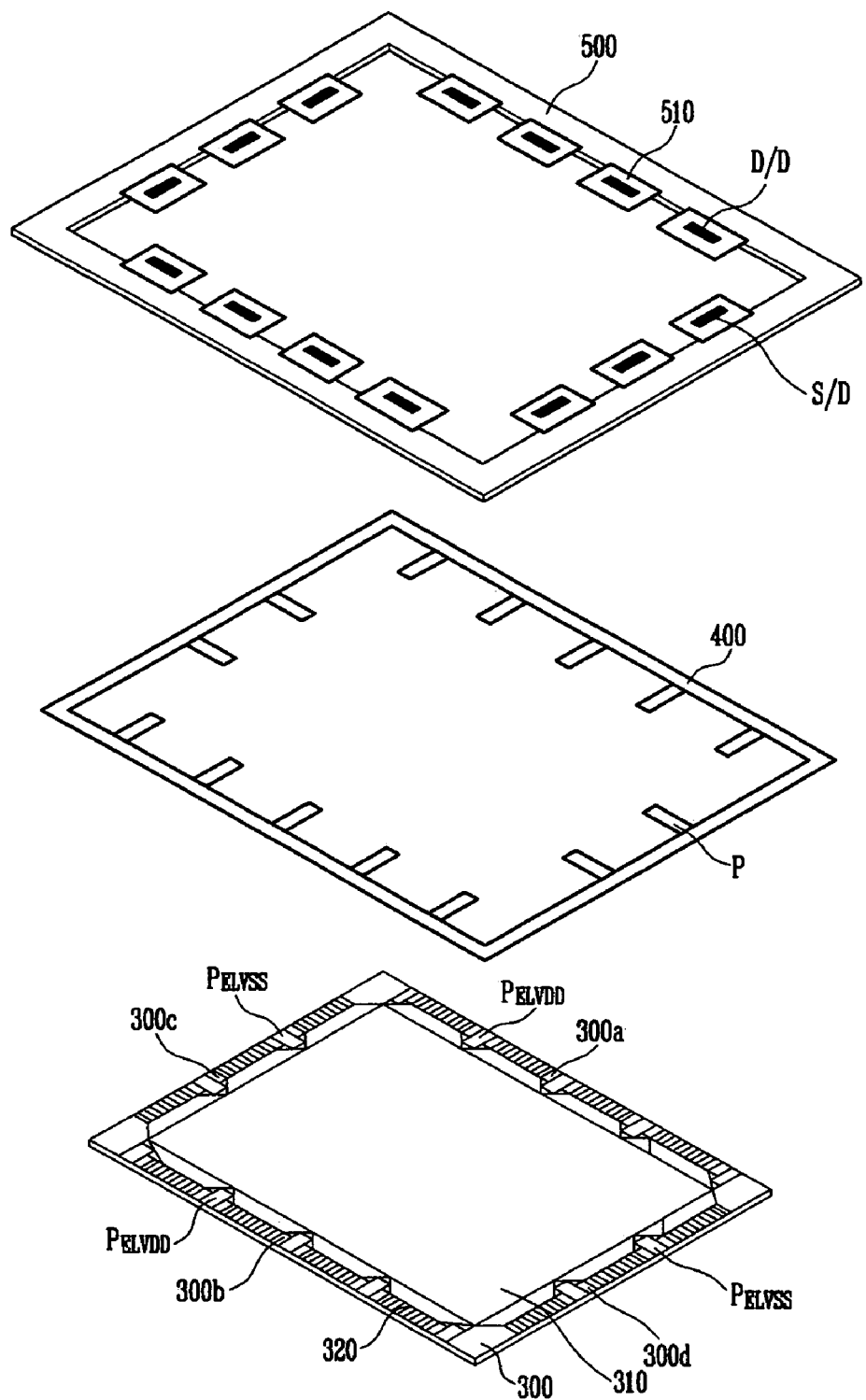
FIG. 3 is an exploded perspective view of an organic light emitting display according to an embodiment of the present invention.
Figure 4:
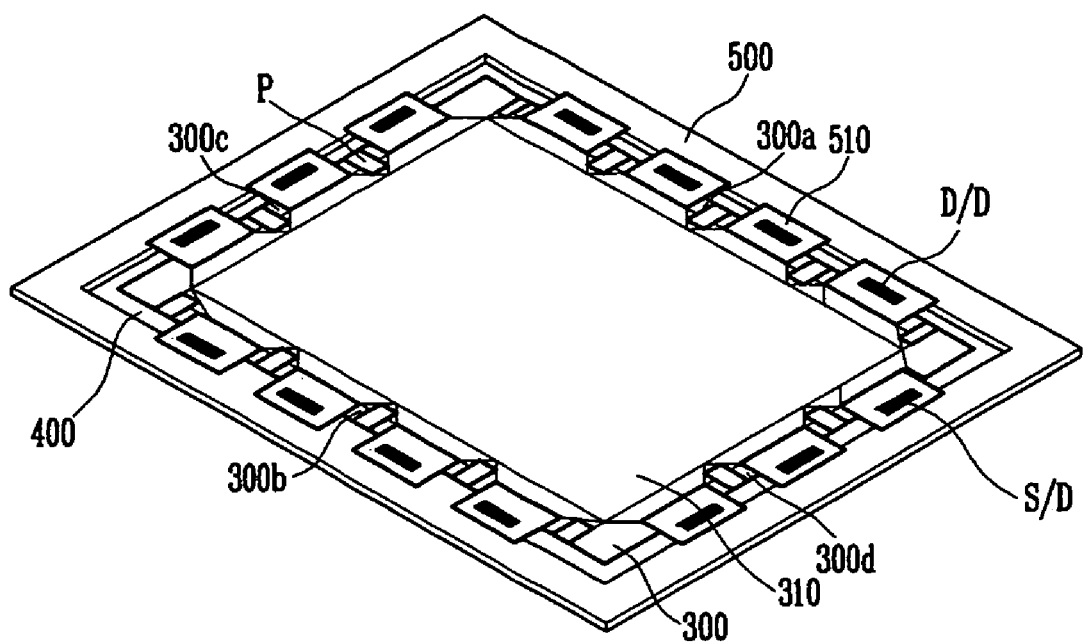
FIG. 4 is a perspective view of an assembly of the organic light emitting display of FIG. 3.

FIG. 3 is an exploded perspective view of an organic light emitting display according to an embodiment of the present invention. FIG. 4 is a perspective view of an assembly of the organic light emitting display of FIG. 3.

In FIGS. 3 to 4, the scan driver and/or the data driver are not mounted on the organic light emitting display panel but are mounted on an additional Flexible Printed Circuit Board (FPCB). However, the present invention is not limited thereto.

Referring to FIGS. 3 and 4, an organic light emitting display includes an organic light emitting display panel 300, a voltage supplier FPCB 400, and a driving board 500. The voltage supplier FPCB 400 transmits first and second voltages ELVDD and ELVSS to the organic light emitting display panel 300. In addition, driving FPCBs 510 are further coupled between the driving board 500 and the organic light emitting display panel 300.

The organic light emitting display panel 300 includes a pixel unit 310 for displaying an image, a plurality of power source pads $P_{ELVDD}$ and $P_{ELVSS}$ for respectively supplying voltages ELVDD and ELVSS and driving signals to the pixel unit 310, and signal pads 320. The power source pads $P_{ELVDD}$ and $P_{ELVSS}$ and the signal pads 320 are positioned at edges 300a to 300d of the organic light emitting display panel 300.

The pixel unit 310 includes a plurality of pixels that are not shown. The pixel unit 310 displays an image to correspond to the driving signals supplied by the signal pads 320 and the voltages ELVDD and ELVSS supplied by the power source pads $P_{ELVDD}$ and $P_{ELVSS}$.

The pixel unit 310 may be formed to emit light from both sides thereof. For example, the pixel unit 310 may include transparent devices formed on a transparent substrate to emit light from both sides. Alternately, the pixel unit 310 may emit light from sides thereof by including at least two pixel regions to emit light in different directions.

As such, since images can be displayed on both sides of the pixel unit 310 when the pixel unit 310 is formed to emit light from the both sides thereof, the utility of the organic light emitting display can be enhanced.

The power source pads $P_{ELVDD}$ and $P_{ELVSS}$ are distributed and arranged on at least two edges of one outer side of the pixel unit on one side of the organic light emitting display panel 300.

In more detail, the power source pads $P_{ELVDD}$ and $P_{ELVSS}$ include first power source pads $P_{ELVDD}$ for receiving first voltages ELVDD and second power source pads $P_{ELVSS}$ for receiving second voltages ELVSS.

Each of the first and second power source pads $P_{ELVDD}$ and $P_{ELVSS}$ is distributed on at least two edges of one side of the organic light emitting display panel 300 to receive the first and second voltages ELVDD and ELVSS from both sides of the voltage supplier FPCB 400.

For example, a plurality of the first power source pads $P_{ELVDD}$ may be formed at first and second edges 300a and 300b to face each other on the one side of the organic light emitting display panel 300. Accordingly, the first power source pads $P_{ELVDD}$ receive the first voltage ELVDD from both sides and can transmit the same to the pixel unit 310.

A plurality of the second power source pads $P_{ELVSS}$ may be formed at third and fourth edges 300c and 300d to face each other on the one side of the organic light emitting display panel 300. Accordingly, the second power source pads $P_{ELVSS}$ receive the second voltage ELVSS from both sides and can transmit the same to the pixel unit 310.

That is, the first power source pads $P_{ELVDD}$ and the second power source pads $P_{ELVSS}$ may be formed at different edges on the side of the organic light emitting display panel 300.

However, the arrangement of the power source pads $P_{ELVDD}$ and $P_{ELVSS}$ of the present invention is not limited to the above. That is, each of the first and second power source pads $P_{ELVDD}$ and $P_{ELVSS}$ is arranged in at least three edges on the one side of the organic light emitting display panel 300. Accordingly, each of the first and second power source pads $P_{ELVDD}$ and $P_{ELVSS}$ can receive the first and second voltages ELVDD and ELVSS from at least three directions. In this case, at least some of the first and second power source pads $P_{ELVDD}$ and $P_{ELVSS}$ may be formed at the same edge on the one side of the organic light emitting display panel 300.

The signal pads 320 are electrically coupled to the driving FPCB 510 provided independently from the voltage supplier FPCB 400 to transmit a driving signal supplied by the driving FPCB 510 to the pixel unit 310. A plurality of the signal pads 320 may be provided between the first and second power source pads $P_{ELVDD}$ and $P_{ELVSS}$. A plurality of the driving FPCBs 510 may be electrically coupled to the signal pads.

The voltage supplier FPCB 400 include a plurality of pads P electrically coupled to the first and second power source pads $P_{ELVDD}$ and $P_{ELVSS}$ of the organic light emitting display panel 300. For example, the voltage supplier FPCB 400 may include the pads P to be overlapped with and electrically coupled to the first and second power source pads $P_{ELVDD}$ and $P_{ELVSS}$ of the organic light emitting display panel 300.

In addition, the voltage supplier FPCB 400 is electrically coupled to the driving board 500 through a pad that is not shown. Accordingly, the voltage supplier FPCB 400 transmits the first and second voltages ELVDD and ELVSS from the driving board 500 to the organic light emitting display panel 300.

To this end, the voltage supplier FPCB 400 includes lines (not shown) formed in a single layer or multiple layers for supplying the first and second voltages ELVDD and ELVSS. The voltage supplier FPCB 400 uniformly applies the first and second voltages ELVDD and ELVSS to the entire organic light emitting display panel 300 through the internal line.

However, in the present invention, the voltage supplier FPCB 400 is arranged not to be overlapped with the pixel unit 310 of the organic light emitting display panel 300. For example, the voltage supplier FPCB 400 may be arranged on the outer circumference of the organic light emitting display panel 300 in the form of surrounding an edge on a side of the organic light emitting display panel 300.

In other words, since the voltage supplier FPCB 400 does not cover the pixel unit 310, the image is not disturbed from being displayed even when the pixel unit 310 emits light from both sides thereof.

The driving board 500 is electrically coupled to the voltage supplier FPCB 400 and the driving FPCB 510 and mounts a power supply and/or a timing controller which are not shown. The driving board 500 generates the voltages ELVDD and ELVSS and/or a control signal and transmits them to the voltage supplier FPCB 400 and/or the driving FPCB 510.

However, in the present invention, since the driving board 500 is formed not to be overlapped with the pixel unit 310, the image is not disturbed from being displayed even when the pixel unit 310 emits light from both sides thereof. For example, the driving board 500 may be arranged on the outer circumference of the organic light emitting display panel 300 in the form of surrounding an edge on a side of the organic light emitting display panel 300.

The driving FPCB 510 may include a scan driver S/D for supplying a scan signal to the pixel unit 310 and/or a data driver D/D for supplying a data signal to the pixel unit 310.

The driving FPCB 510 is electrically coupled to the driving board 500 and is driven by the driving board 500. That is, the scan driver S/D and/or the data driver D/D which are arranged Ion the driving FPCB 510 may be driven corresponding to the control signals transmitted from the driving board 500.

According to the present invention described above, the power source pads $P_{ELVDD}$ and $P_{ELVSS}$ of the organic light emitting display panel 300 are distributed and arranged at two edges. The respective first and second voltages ELVDD and ELVSS are supplied to the organic light emitting display panel 300 from at least two directions.

Thus, in the organic light emitting display panel 300, the IR drop of the first and second voltages ELVDD and ELVSS can be minimized. Therefore, the organic light emitting display panel 300 can display an image with uniform image quality even in a big size. Accordingly, the organic light emitting display can be applied to various displays such as a TV and a sign board.

In addition, the organic light emitting display device according to the present invention further includes a plurality of pads P electrically coupled to the power source pads $P_{ELVDD}$ and $P_{ELVSS}$ of the organic light emitting display panel 300. In addition, according to the present invention, the voltage supplier FPCB 400 for supplying the first and second voltages ELVDD and ELVSS to the organic light emitting display panel 300 through the internal line is additionally provided. The first and second voltages ELVDD and ELVSS can be evenly applied to the organic light emitting display panel 300 through the internal line of the voltage line supplying FPCB 400.

Furthermore, since the voltage supplier FPCB 400 and the driving board 500 are designed not to be overlapped with the pixel unit 310 of the organic light emitting display panel 300, the present invention can be usefully applied to a dual type organic light emitting display. Therefore, the utility of an organic light emitting display can be enhanced.

While the present invention has been described in connection with certain exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting display device, comprising:
an organic light emitting display panel comprising a pixel unit which displays an image and a plurality of first and second power source pads which are disposed outside the pixel unit and are disposed at two or more edges of the organic light emitting display panel, the organic light emitting display panel receiving each of first and second voltages from at least two different directions; and
a voltage supplier Flexible Printed Circuit Board (FPCB) comprising a plurality of pads which are respectively electrically coupled to the plurality of first and second power source pads, the voltage supplier FPCB being arranged on an outer circumference of the organic light emitting display device to not overlap the pixel unit.

2. The organic light emitting display device as claimed in claim 1, wherein the plurality of first power source pads are formed respectively at a first edge of one side of the organic light emitting display panel and a second edge thereof facing the first edge and wherein the plurality of second power source pads are formed respectively at a third edge of one side of the organic light emitting display panel and a fourth edge thereof facing the third edge.

3. The organic light emitting display device as claimed in claim 2, wherein a plurality of the first power source pads are formed at the first and second edges.

4. The organic light emitting display device as claimed in claim 2, wherein a plurality of the second power source pads are formed at the third and fourth edges.

5. The organic light emitting display device as claimed in claim 1, wherein the plurality of first and second power source pads are formed at different edges of one side of the organic light emitting display panel.

6. The organic light emitting display device as claimed in claim 1, wherein each of the plurality of first and second power source pads receives the first and second voltages respectively from both directions of the voltage supplier FPCB.

7. The organic light emitting display device as claimed in claim 1, wherein a plurality of signal pads to supply driving signals to the pixel unit are formed between the plurality of first and second power source pads.

8. The organic light emitting display device as claimed in claim 7, further comprising:
a driving Flexible Printed Circuit Board (FPCB) electrically coupled to the signal pads and provided independently from the voltage supplier FPCB; and
a driving board electrically coupled to the driving FPCB to drive the driving FPCB.

9. The organic light emitting display device as claimed in claim 8, wherein the driving board is arranged to not overlap the pixel unit.

10. The organic light emitting display device as claimed in claim 9, wherein the driving board is arranged on the outer circumference of the organic light emitting display panel.

11. The organic light emitting display device as claimed in claim 8, wherein the driving board is electrically coupled to the voltage supplier FPCB to supply the first and second voltages to the voltage supplier FPCB.

12. The organic light emitting display device as claimed in claim 8, wherein the driving FPCB comprises at least one of a scan driver and a data driver and supplies at least one of a scan signal and a data signal to the pixel unit.

13. The organic light emitting display device as claimed in claim 1, wherein the pixel unit emits light from both sides thereof.

* * * * *